United States Patent [19]

Erb

[11] 4,247,916
[45] Jan. 27, 1981

[54] MEMORY DEVICE IN WHICH ONE TYPE CARRIER STORED DURING WRITE CONTROLS THE FLOW OF THE OTHER TYPE CARRIER DURING READ

[76] Inventor: Darrell M. Erb, 1100 Runnymead Dr., Los Altos, Calif. 94022

[21] Appl. No.: 89,490

[22] Filed: Oct. 30, 1979

Related U.S. Application Data

[63] Continuation of Ser. No. 866,541, Jan. 3, 1978, abandoned.

[51] Int. Cl.³ .............................................. G11C 11/40
[52] U.S. Cl. .................................... 365/182; 357/23; 365/185
[58] Field of Search ............... 365/182, 183, 184, 185; 357/23, 24

[56] References Cited

U.S. PATENT DOCUMENTS

| | | | |
|---|---|---|---|
| 3,728,695 | 4/1973 | Bentchkowsky | 365/185 |
| 3,971,055 | 7/1976 | Arai | 365/182 |
| 4,000,504 | 12/1976 | Berger | 357/23 |
| 4,090,257 | 5/1978 | Williams | 365/184 |
| 4,112,575 | 9/1978 | Fu et al. | 365/182 |
| 4,122,543 | 10/1978 | Bert et al. | 365/182 |
| 4,126,900 | 11/1978 | Koomen et al. | 365/185 |
| 4,158,238 | 6/1979 | Erb | 365/182 |

*Primary Examiner*—Stuart N. Hecker
*Attorney, Agent, or Firm*—Paul Hentzel

[57] ABSTRACT

A RAM device employs an array of dual gated transistor memory cells accessed by row and column decoding. A separate P type memory region is provided under the column gate which acquires holes as a function of the input data during the write cycle, for controlling the flow of an output electron current during the subsequent read cycle. The write holes flow from the substrate into the P memory region to record a "1" when both the row gate and the column gate are at a low positive potential. The write holes become trapped in the P memory region when the low write voltage on the row gate is replaced by a higher storage voltage. During the read cycle both gates are high, and electron current flows from source to drain along a continuous electron conductive path formed under both gates. The high row voltage causes electron conduction at the surface of the P substrate under the row gate by establishing an N type inversion layer. The high column voltage in combination with the positive charge of the write holes promotes the flow of read electrons under the column gate through a buried N channel adjacent to the P memory region. The read conductive path between the source and drain is formed by the row inversion layer plus the N channel. The stratified charge structure functions as an additional gate beneath the column gate which requires trapped write holes in order to allow electron flow when the row and column gates are activated during read.

36 Claims, 20 Drawing Figures

FIG. 1

FIG. 2A
(WRITE "1")

FIG. 2B
(WRITE "0")

FIG. 2C
(STORE "1")

FIG. 2D
(STORE "0")

FIG. 2E
(READ "1")

FIG. 2F
(READ "0")

MEMORY DEVICE IN WHICH ONE TYPE CARRIER STORED DURING WRITE CONTROLS THE FLOW OF THE OTHER TYPE CARRIER DURING READ

This is a continuation of application Ser. No. 866,541, filed Jan. 3, 1978, now abandoned.

DISCUSSION OF PRIOR ART

Heretofore, dynamic RAM cells with internal gain required the combined gain of at least three transistors. Information was stored on the gate of one of the transistors. During cell readout this transistor controlled the current in the output sense line. For larger memories the multiple transistor cells have been discontinued in favor of the higher density one transistor cell which stores the input signal charge on an internal storage capacitor. During the readout of the cell the signal charge is dumped onto a relatively long sense line causing a small voltage change which is detected by a sensitive sense amplifier.

SUMMARY OF THE INVENTION

It is therefore an object of this invention to provide a semiconductor switch in which a charge of one polarity is stored for controlling the flow therethrough of current of the opposite polarity.

It is another object of this invention to provide a current mode random access memory with nondestructive read and a fast access time.

It is still another object of this invention to provide a random access memory which has a higher cell density and wafer yield than heretofore.

It is a further object of this invention to provide random access memory with high gain, high density cells.

It is yet a further object of this invention to provide random access memory in which the cell access structure functions to redistribute the holes during writing, maintain the hole charge during storage, and establish an electron flow path during reading.

It is still a further object of this invention to provide a random access memory having cells which employ a conductive path for carriers of one polarity during write and which employ a conductive path for carriers of the opposite polarity during read.

It is another object of this invention to provide a random access memory having a density approaching the theoretical limit.

It is a further object of this invention to provide a random access memory in which each output sense amplifier is shared by adjacent pairs of cell columns.

It is another object of this invention to provide a random access memory having a drain bus common to the cell columns on either side thereof, and a source bus common to the cell columns on either side thereof.

BRIEF DESCRIPTION OF THE DRAWING

Further objects and advantages of the present invention and the operation of a write conductive path and a read conductive path employing opposite polarity carriers will become apparent to those skilled in the art from the following detailed description taken in conjunction with the drawings in which.

DETAILED DESCRIPTION OF THE PREFERRED EMBODIMENTS

Section I

P Memory Region Embodiment

A. Cell Structure

Figure 1:
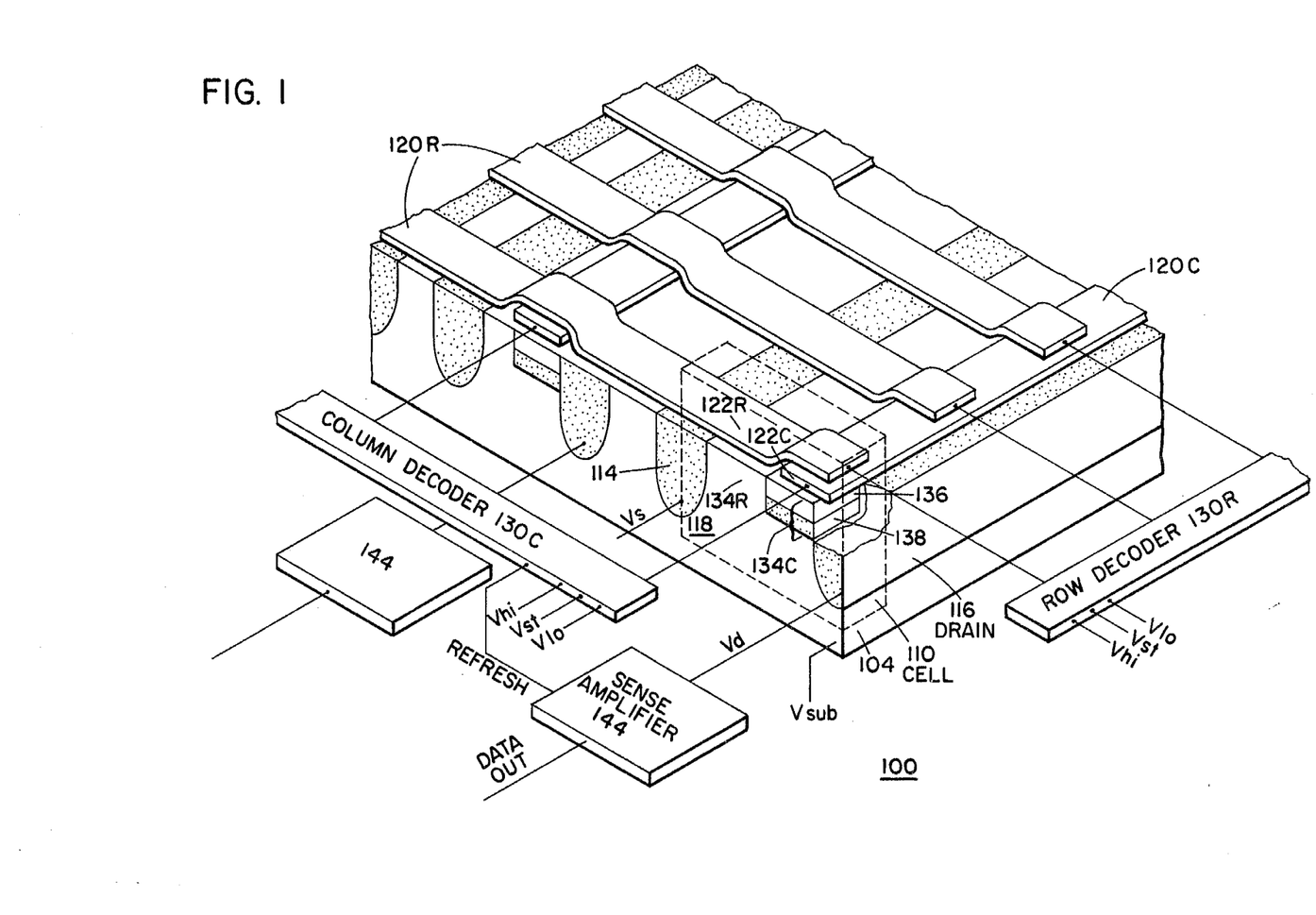
FIG. 1 is a partially broken away, isometric view in section of a RAM showing the internal structure of an individual memory cell.

Referring to FIG. 1 there is shown a RAM 100 including P substrate 104 with an array of memory cells 110 formed by N+ source buses 114, N+ drain buses 116, and active channel 118 therebetween. Each cell 110 is accessed by a row lead 120R through row gate electrode 122R and by a column lead 120C through column gate electrode 122C. Column and row decoders 130C and 130R systematically supply a high voltage (Vhi-R and Vhi-C), or a low voltage (Vlo-R and Vlo-C), or an intermediate storage voltage (Vst) to the appropriate row and column leads defining the writing, reading, and refreshing cycles of RAM 100. A row gate zone 134R is formed within active channel 118 immediately under row gate electrode 122R. A PN column gate zone 134C is formed within active channel 118 immediately under column gate electrode 122C by upper P region 136 and lower N region 138. Upper P region 136 is the memory storage area and acquires a hole charge from P substrate 104 during the write cycle as a function of DATA IN on column lead 120C. During the read mode, the memory hole charge in P region 136 modulates the source-to-drain electron current passing through the adjacent lower N region 138 to form DATA OUT from sense amplifiers 144.

B. Writing

Figure 2A:
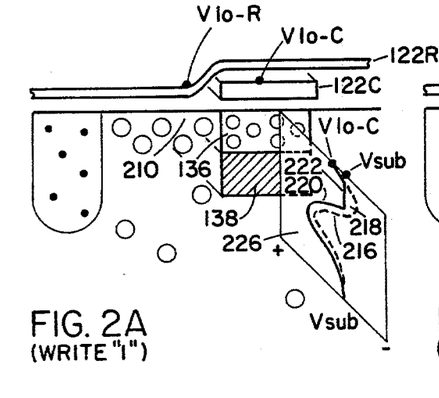
FIGS. 2A-F is a series of side sectional views of an individual cell (with energy diagrams illustrated in perspective) showing the control of redistribution holes during write and the establishment of an output electron current path during read.
Figure 2B:
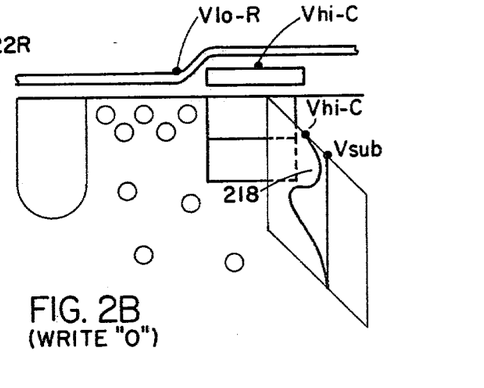

During the write cycle, the selected column gate lead 120C receives DATA IN in the form of a Vlo-C control voltage for writing a "1" in P memory region 136 (see FIG. 2A) and Vhi-C control voltage for writing "0" (see FIG. 2B). The selected row lead 120R receives Vlo-R during writing for causing a portion of the holes normally distributed throughout substrate 104 to temporarily accumulate along the surface region 210 of row gate zone 134R. When Vlo-C is present on column gate electrode 122C, as shown in FIG. 2A, a portion of the hole accumulation flows into upper P region 136 and forms a high concentration of memory holes recording a "1". The accompanying energy diagram (drawn in perspective in FIG. 2) shows an initial energy profile 216 (dashed lines) vertically through the column portion of memory cell 100. Energy profile 216 is established by the dopant concentration within P region 136 and N region 138 and Vlo-C control voltage on column gate electrode 122C. It is assumed here that a "0" (no hole storage) was previously recorded in P region 136 as opposed to a "1" which would require some hole storage. Initial profile 216 has a hole retaining pocket 218 within upper P region 136 which offers a lower energy state for holes (less positive potential) than the surrounding substrate 104. When Vlo-R is applied to row gate electrode 122R, substrate holes are drawn to row surface region 210 and flow into the lower energy pocket 218 within upper P region 136. As pocket 218 traps more holes the increasing hole charge therein forces initial energy profile 216 into write "1" profile 220, and neutralizes pocket 218 forming flat portion 222 at Vsub potential. The adjacent electron pocket 226 remains depleted of electrons due to a field gradient established by the drain voltage Vd. The N dopant concentration of N drain 116 is preferrably higher than the N dopant concentration of lower N region 138 and is therefore not depleted.

When Vhi-C is present on column gate electrode 122C, as shown in FIG. 2B, the holes concentrated in row gate zone 134 are prevented from flowing into upper P region 136. The FIG. 2B energy diagram shows pocket 218 at a higher energy level for holes (more positive) than substrate 104. Pocket 218 may not receive substrate holes while Vhi-C is applied to gate 122C, and any holes in pocket 218 from a previously recorded "1" are returned to substrate 104. The absence (or low concentration) of memory holes in upper P region 136 is the record of an "0". Increased doping level in P region 136 will result in more holes in P region 136 when recording an "0", causing a slight flat on energy profile 216. Writing a "1" would then require even more holes causing more extended flat region in energy profile 222.

In summary, a "1" is recorded in the form of a hole charge in upper P region 136 via a hole conductive path across active channel 118 established by the appropriate control voltages (Vlo-R, Vlo-C). An "0" is recorded in upper P region 136 by preventing the hole charge from entering upper P region 136. The holes are deterred by applying control voltage Vhi-C.

C. Storage

Figure 2C:
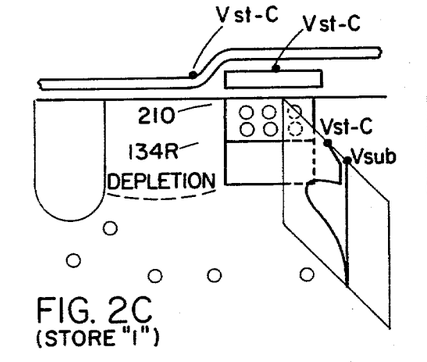
Figure 2D:
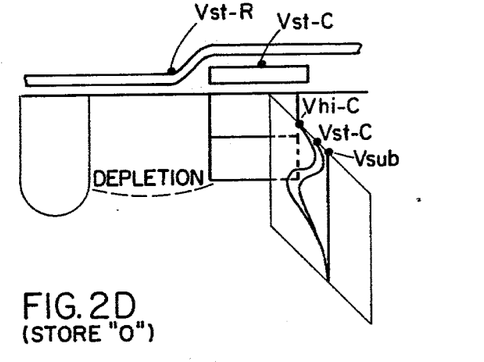

Near the termination of the writing mode, an intermediate storage voltage Vst-R, (Vlo<Vst-R<Vhi-R) replaces Vlo-R on row gate 122R. The holes concentrated in surface region 210 are redistributed throughout substrate 104 as shown in FIGS. 2C and 2D, leaving row gate zone 134R in a hole depletion condition. The hole charge within pocket 218 is maintained therein by Vhi-C on column gate 134C. Later, at the termination of the writing mode, Vst-C may be applied to column gate 134C. However, the hole charge may not return to substrate 104 because of the positive potential in depletion zone 134R. These memory holes are isolated on all sides from substrate 104 (see isolation section II hereinafter) and are trapped within upper P region 136 until the next write mode.

D. Reading

Figure 2E:
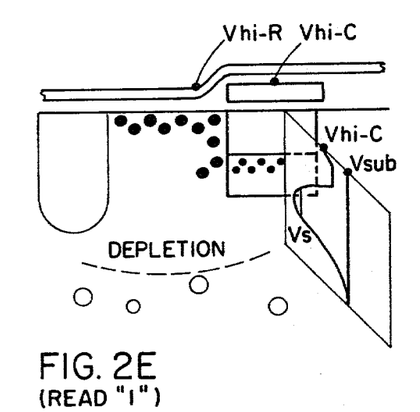
Figure 2F:
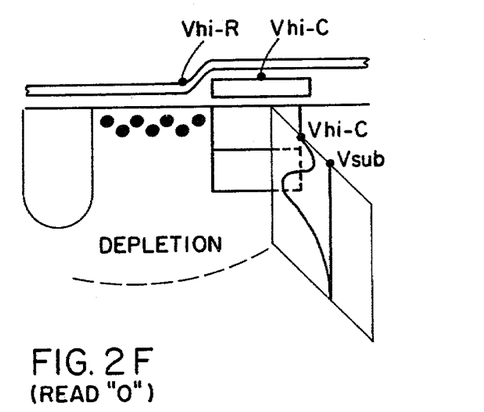

During the read mode, (see FIGS. 2E and 2F) Vhi-R is applied to selected row lead 120R and Vhi-C is applied to selected column lead 120C. Vhi-R on row gate electrode 122R establishes an N type inversion layer in surface region 210 which supports electron conduction. Vhi-C on column gate electrode 122C favors electron conduction across lower N region 138; however, Vhi-C alone is insufficient to support electron flow. A "1" hole charge recorded in upper P region 136, supplements the Vhi-C column voltage. The combined effect of the stored positive charge and the positive Vhi-C voltage is sufficient to render lower N region electron conductive as shown in FIG. 2E. Electron output currents flow across active channel 118 from source 114 to drain 116 along an electron conductive path formed by N type inversion region 210 under row gate electrode 122R and lower N region under column gate electrode 122C. Vsd from source 114 to drain 118 provides an electric field across active channel 118 which results in electron flow during read if a "1" is recorded in upper P region 136. Conversely, a stored "0" renders N region 138 nonconductive and no current flows from source to drain. Sense amplifier 144 is able to detect the read out current. A necessary requirement for readout is that the cell only conduct current when the row is at Vhi-R and the column is at Vhi-C.

Section II

Isolation

A. Field Shield Technique

Figure 3A:
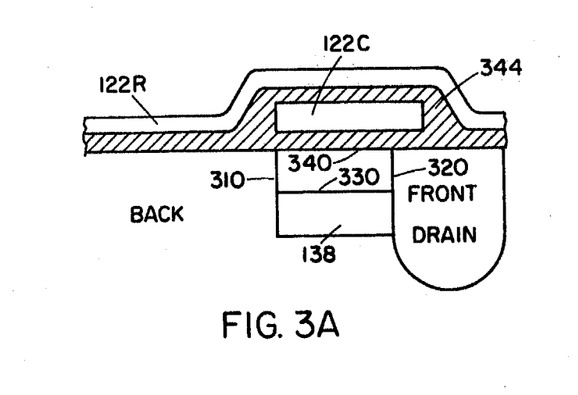
FIGS. 3A and 3B are side and front views in section showing isolation techniques for retaining the memory holes within the memory P region.
Figure 3B:
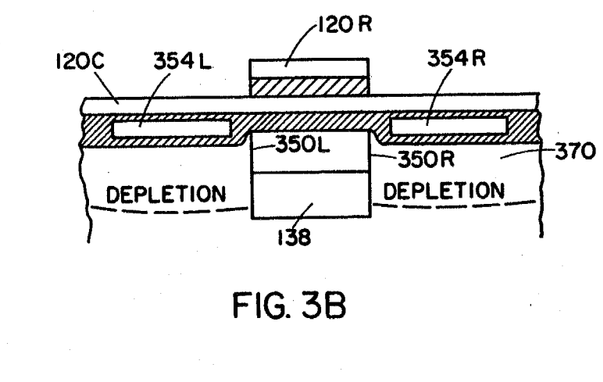

Isolation is required to inhibit hole conduction between upper P region 136 and substrate 104 at all times except during the write cycle. Residual holes from substrate 104 are prevented from entering low energy record "0" pockets 218, by several isolation techniques. Upper P region 136 in this embodiment is a six sided volume as shown in FIGS. 3A and 3B. Hole isolation along each side is effected as follows:

Back: Substrate holes enter upper P region 136 through a hole port, back face 310 (see FIG. 3A) and become memory holes during write "1". The memory holes cannot escape and additional substrate holes cannot enter via hole port 310 because of the later established hole depletion region within row gate zone 134R effected by Vst on row gate electrode 122R.

Front: Substrate holes cannot enter through front face 320 of upper P region 136 (see FIG. 3A) into drain 116 because of the high potential thereof established by the positive voltage Vd applied to drain 116.

Bottom: Substrate holes cannot enter through bottom face 330 of upper P region 136 (see FIG. 3A) because of the potential barrier across lower N region 138.

Top: Memory holes cannot escape through top face 340 of upper P region 136 (see FIG. 3A) because gate insulation 344.

Sides: The sides of cell 110 have two isolation requirements: (1) containment of the memory holes in pocket 218, and (2) isolation of the adjacent N channels 114 and 116 during readout. Sidewall isolation is accomplished by generating a depleted MOS surface along the P type substrate in region 370 between adjacent row electrodes 122. The surface potential of region 370 is intermediate between the source potential Vs and the most positive potential of the memory hole pocket 136. Substrate holes cannot enter through side faces 350L and 350R of upper P region 136 because of positively biased isolation electrodes 354L and 354R. Isolation electrodes 354 extend parallel to row gate lead 120R on either side thereof and create a hole depletion region for the side faces 350 of every cell in the row. These electrodes are dc biased to create a small positive surface potential in the underlying P type silicon.

B. Other Isolation Techniques

Isolation electrodes 354 may be biased at substrate potential Vsuo provided a shallow N type ion implantation of the appropriate dose is performed prior to the deposition of the isolation electrode material.

Instead of using isolation electrodes 354, thick field oxide may be employed to confine N type readout channel 138 and the hole storage pocket 136.

C. Refresh

Isolation techniques inhibit hole migration between substrate 104 and upper P region 136. However, thermally generated holes may degrade the signal stored in pocket 218 causing a stored "0" (see FIG. 2B) to be degraded toward a stored "1". When a hole is generated by some mechanism whether or not it degrades the signal depends on where it was generated and the local electric field. Most thermally generated holes will flow to substrate 104.

As with all dynamic memories, catastrophic degradation of the "0" is prevented by refreshing the stored data. This is accomplished by periodically reading and rewriting the data row by row.

Section III

Figure 4:
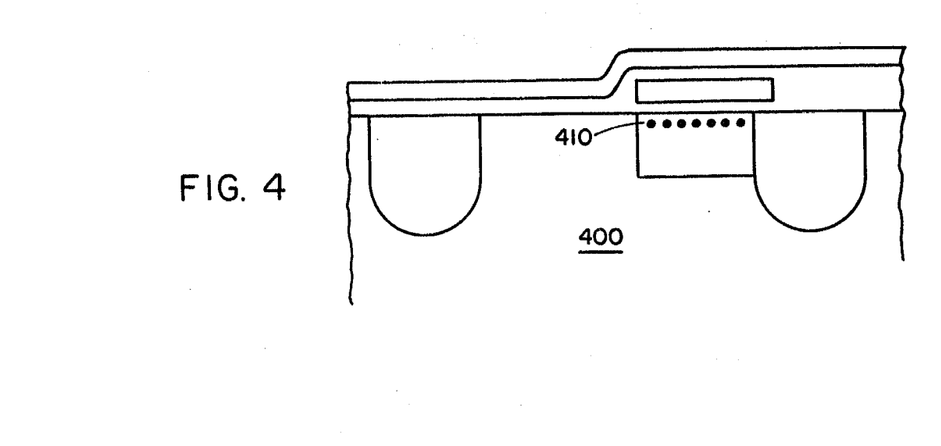
FIG. 4 is a side view in section of a P memory inversion layer embodiment.

P Memory Inversion Layer (FIG. 4)

The P memory region embodiment of FIGS. 1–3 may be modified by eliminating upper P region 136, and storing write holes within a P type inversion layer 410 formed by applying a voltage to column electrode 122C which is negative with respect to the substrate voltage Vsub.

Suitable operating voltages for the inversion layer memory are:

| | |
|---|---|
| Vlo-R | −1 to 0 volts |
| Vlo-C | −6 volts |
| Vst-R | +3.5 volts |
| Vhi-R | +8 volts |
| Vhi-C | −4 volts |
| Vd | +6 volts |
| Vs | +volts |

However, the operating voltages for all embodiments may be selected from a voltage range to accomodate various applications. In addition, the Vst-C may be eliminated by using Vlo-C or Vhi-C as the column storage potential. That is, a range of voltages may be applied to the column electrodes without effecting the stored data. Employing Vhi-C as the storage potential maintains each column electrode in a read-ready state in which an entire row of cells may be read merely by replacing Vst-R with Vhi-R. The column voltage need not be changed between the storage mode and the read mode in the read-ready operation embodiment. The upper P region embodiment of FIG. 1 may be designed to operate with all positive voltages in contrast to the bipolar operation of the inversion layer embodiment. If desired, the number of applied voltage levels may be minimized by designing the cells to operate with Vlo-C=Vlo-R, or Vhi-R=Vhi-C. The limited number of applied voltages can still generate the optimum internal voltages on each cell element by modifying fabrication steps involving the diffusion, ion implantation, and oxide thickness.

Section IV

Method of Manufacture

The following steps contain standard MOS oxide growth, masking, ion implantation, polysilicon deposition, diffusion, and etching steps; and illustrate a basic fabrication method for making the stratified charge memory. The fabrication steps may be modified to accomodate various applications.

A. Fabrication of Upper P Region RAM 100

Step (1) Provide P type silicon substrate 104 having the desired resistivity. Resistivities of from about 5 to about 50 ohm-cm are suitable.

Step (2) Form a shallow N type layer over substrate 104 preferably by As ion implantation having a concentration sufficient to maintain the proper surface potential for channel isolation.

Step (3) Grow a field oxide over substrate 104. One micrometer of silicon dioxide is suitable.

Step (4) Mask isolation strips to expose row strips therebetween each containing a row of active channel sites. Etch the temporary field oxide of Step 3 away from each channel strip uncovering the sites for channel gate zones 134R and 134C. Remove mask.

Step (5) Provide oxide in the channel strips forming gate oxide for gates 134R and 134C. A silicon dioxide growth of 1000 Angstroms is suitable.

Step (6) Form a buried N strip, preferably by phosphorus ion implantation, along the entire channel strip through the 1000 Angstrom channel oxide of Step 5. An implantation voltage of 200 Kev and a dose of $2.5 \times 10^{12}$ per square cm are suitable. This buried N strip is eliminated from row gate zone 134 during Step 17. The remaining portions of the buried N strip form buried N region 138 in column gate zone 134C. The temporary one micrometer field oxide of Step 3 protects the isolation strips from the N type implant.

Step (7) Diffuse the phoshorus of Step 6 further into substrate 104 until two times the square root of the diffusivity-time product equals 0.5 micrometers.

Step (8) Form an upper P Strip, preferrably by boron ion implantation, along the entire channel strip through the 1000 Angstrom channel oxide of Step 5. An implantation voltage of 30 Kev with a resultant dose of $3 \times 10^{12}$ per square cm in substrate 104 are suitable. The upper P strip is eliminated from row gate zone 134 during Step 15. The remaining portions of the upper P strip form upper P region 136 in column gate zone 134C. Preferably, further diffusion of the implanted boron should be minimized in subsequent steps.

Step (9) Form the first layer of polysilicon to provide material for the column leads. A deposition of 5000 Angstroms is suitable.

Step (10) Dope the first layer of polysilicon to provide the desired column electrode conductivity.

Step (11) mask to cover column lead strips and etch the exposed strips of the first polysilicon layer leaving column leads 120C and column electrodes 122C.

Step (12) Compensate the phosphorus concentration within row gate zone 134R to overcome the buried N strip formed during Step 6. This counter doping is preferably accomplished by ion implantation of boron until the total P dopant concentration is slightly larger than the N dopant concentration of about $2-5 \times 10^{15}$ per square cm is suitable. Column gate zone 134C is protected from the boron implant by column electrode 122C.

Step (13) Mask to expose the source and drain sites-strips parallel to column leads 120C using the middle of column leads 120C for alignment. Etch the exposed portions of the one micrometer oxide of Step 3 and the 1000 Angstroms oxide of Step 5.

Step (14) Form source buss 114 and drain buss 116 by doping the exposed strips with phosphorus or arsenic.

An ion implantation voltage of 200 Kev with a resultant dose of $1 \times 10^{14}$ per square cm is suitable. Remove mask of Step 13.

Step (15) Dip etch the exposed 1000 Angstrom oxide of Step 5 away from row gate zone 134R.

Step (16) Remove surface boron of Step 8 from row gate zone 134R by etching or oxidizing the exposed portion of substrate 104. The corresponding Step 8 surface boron on column gates 134R is protected by column electrodes 122C.

Step (17) Replace gate oxide over row gate zone 134R removed in Step 15. An oxide growth 1000 Angstroms thick is suitable.

Step (18) Form the second layer of polysilicon to provide material for every other row lead.

Step (19) Dope the second layer of polysilicon to provide the desired row electrode conductivity. P type dopant is preferred in order to favor hole accumulation during WRITE.

Step (20) Mask to cover every other row electrode and etch away the exposed portions of the second polysilicon layer leaving one half of the row leads 120R and electrodes 122R.

Step (21) Etch the 1000 Angstrom oxide of Step 17 away from the remaining rows.

Step (22) Form gate oxide over the remaining exposed row gate zones. An oxide growth 1000 Angstroms thick is suitable.

Step (23) Form the third layer of polysilicon to provide material for the remaining row leads.

Step (24) Dope the third layer of polysilicon to provide the desired conductivity—see Step 19.

Step (25) Mask to cover the remaining row gate zones and etch away the exposed portions of the third polysilicon layer forming row leads 120R and electrodes 122R for the remaining rows.

Step (26) Form suitable contacts to the polysilicon electrodes using standard contact masking and metalization silicon gate processing procedures.

B. Fabrication of Inversion Layer RAM 400

The steps involved in making the inversion layer embodiment of FIG. 5 are the same as the steps of the upper P region embodiment of FIG. 1, except:

(1) The 200 Kev phosphorus implant of Step 6 is reduced. A dose of $1.0 \times 10^{12}$ per square cm is suitable.

(2) The boron implant of Step 8 is eliminated, and step 16 is therefore no longer required.

(3) The boron implant of Step 12 is reduced to just compensate the phosphorus implant of Step 6. A total dose of about $1.5 \times 10^{12}$ per square cm is suitable.

The manufacture of the inversion layer embodiment is simplified because it is not necessary to minimize the diffusion of the implant of Step 8.

Section V

Analog and Multilevel Operation

P memory region 136 (and P inversion layer 410) functions as a control element within cell 110. As such, the level of output electron current (DATA OUT) reflects the quantity of memory charge stored within upper P region 136. A large memory hole charge urges the cell towards heavier electron conduction during read; and a smaller memory charge attenuates the read current. The quantity of memory charge, in turn, varies inversely with the magnitude of Vlo applied to column electrode 122C during write. Therefore, DATA IN on column lead 120C can be analog or multilevel causing DATA OUT on drain 116 to vary in a corresponding analog or multilevel fashion.

Section VI

Memory Cell Area

The stratified memory cell is subject to various layouts. The layouts depicted in FIGS. 5,6,7, and 8 hereinafter illustrate three fundamental cell patterns. The individual cell dimension of each layout is given in terms of feature size (F). In the most dense embodiments F approaches the photolithographic resolution limit.

A. Low Density Layout—5F×2F (10F squared)

Figures 5A, 5C:
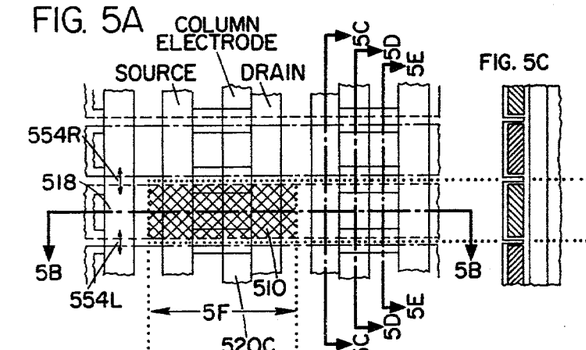
FIGS. 5A-F shows a low density $5F \times 2F$ embodiment.
Figure 5B:
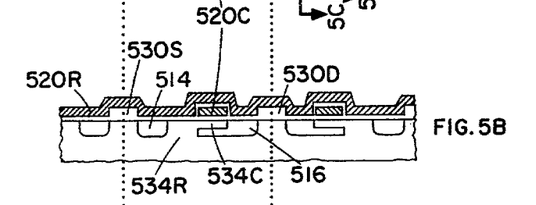
Figure 5D:
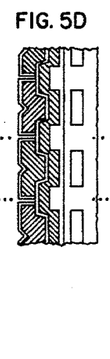
Figure 5E:
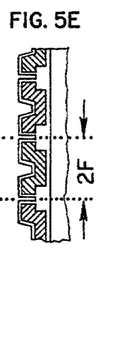

FIG. 5A shows the top view of a low density cell pattern in which each memory cell 510 (cross hatched area) is 5F by 2F. The cell dimension in the direction of row lead 520R is 5F, and is formed by one half of a source-to-source isolation strip 530S, a source buss 514, a row gate zone 534R, a column gate zone 534C, a drain buss 516, and one half of a drain-to-drain isolation strip 530D. This 5F construction is clearly shown in sectional sideview FIG. 5B taken through active channel 518 under row electrode 520R. The cell dimension in the direction of column lead 520C is 2F and is formed by one half of a row isolation strip 554L, active channel 518, and one half of another row isolation 554R. The 2F construction is shown in sectional front views 5C, 5D, and 5E taken along a drain buss, a column lead, and row gate zones respectively. This close spacing between adjacent row leads 520R is accomplished by employing three separate polysilicon layers during fabrication of the one cycle read memory of FIG. 4 (steps 9, 18, and 22). One polysilicon layer forms column leads 520C, and two additional layers form alternate sets of row leads 520R. If a single polysilicon layer were employed to form row leads 520R, the resulting cell dimension in the direction of column lead 520C would be 3F.

Each column of memory cells in the one cycle read layout has a separate drain buss 516 (and a separate source buss 514) permitting each cell in a selected row to be read separately via the drain current to a sense amplifier.

Figure 5F:
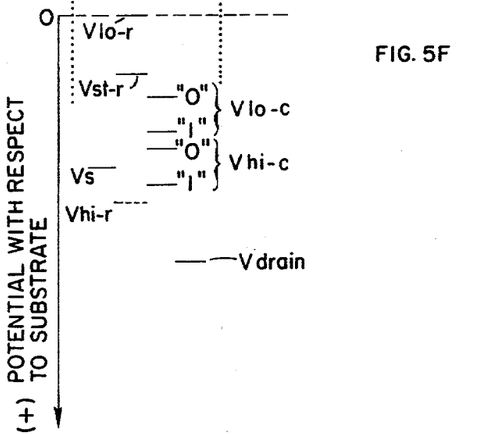

FIG. 5F is a potential diagram of cell 510 showing the relative values of source voltage Vs, drain voltage Vd, and internal voltages within cell 510 established by applied voltages Vlo-R, Vhi-R, Vst-R, Vlo-C, and Vhi-C. The operation of cell 510 and the application of these voltages is depicted in FIG. 2. Vlo-r is the surface potential along the top of row gate zone 534R when Vlo-R is applied to row lead 520R for writing. Vlo-r is sufficiently low to permit hole accumulation within row gate zone 534R. Vst-r is the surface potential along the top of row gate zone 534R when Vst-R is applied to row lead 520R during the storage mode. Vst-r is less than Vs and prevents current flow across row gate zone 534R. Vst-r is greater than the maximum potential of upper P region 536 established by either column voltage Vlo-R or Vhi-R. Vhi-r (shown in dashed lines) is a non-realized surface potential which is prevented from developing along the top of row gate zone 534R due to the clamping effect of Vs during reading. The inversion layer established by Vhi-R prevents the surface potential along the top of row gate zone 534R from rising above Vs. Vhi-c is the maximum potential within the depleted buried N channel 538 when Vhi-C is applied to column lead 520C during read. Vhi-c has two values, one on either side of Vs, depending on whether a "1" or a "0" is recorded in upper P region 536. The conduction path across column gate zone 534C via buried N region 538 is conditional on the stored data. The Vhi-c for a recorded "1" is greater than Vs and permits the conduction of read current across cell 510. The Vhi-c for a recorded "0" is less than Vs and prevents the flow of read current. Vio-c is the maximum potential within buried N channel 538 when Vlo-C is applied to column lead 520 during storage. Vlo-c also has two values, one for a recorded "1", and one for a recorded "0". However, neither of the values of Vlo-c will support current flow across cell 510.

B. One Cycle Read Layout—4F×2F (8F squared)

Figure 6:
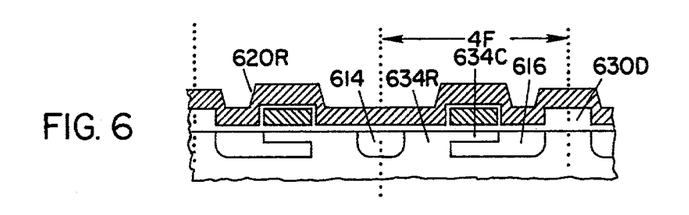
FIG. 6 is a sectional side view of a one cycle read $4F \times 2F$ embodiment.

FIG. 6 shows a sectional side view of a one cycle read cell pattern in which each memory cell is 4F×2F. The cell dimension in the direction of row lead 620R is 4F, and is formed by one half of source buss 614, a row gate zone 634R, a column gate zone 634C, a drain buss 616, and one half of a drain-to-drain isolation strip 630D. Source-to-source isolation strips 530 of FIG. 5 has been eliminated, and the adjacent sources 514 have been combined to form a single source 614 which is shared between adjacent columns of row gates 634R. The cell structure and dimension in the direction of column lead 620C is similar to the low density embodiment shown in FIGS. 5C, D and E.

C. Two Cycle Layout—3F×2F (6F squared)

Figure 7:
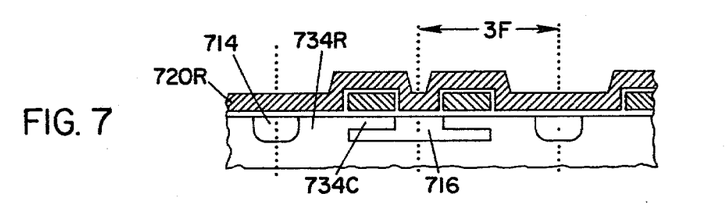
FIG. 7 is a sectional side view of a two cycle read $3F \times 2F$ embodiment.

FIG. 7 shows a sectional side view of a two cycle read cell pattern in which each memory cell is 3F×2F. The cell dimension in the direction of row lead 720R is 3F, and is formed by one half of a source buss 714, a row gate zone 734R, a column gate zone 734C, and one half of a drain buss 716. Each column of memory cells shares a common source with the adjacent column of cells on one side, and shares a common drain with the adjacent column of cells on the other side. Only every other cell in each row can be read out at one time. The readout cycle for the common drain embodiment requires two cycles. The cell structure and dimension in the direction of column lead 720C is similar to the low density embodiment shown in FIGS. 5C, D, and E.

D. Four Cycle Read Layout—2F×2F (4F squared)

Figure 8A:
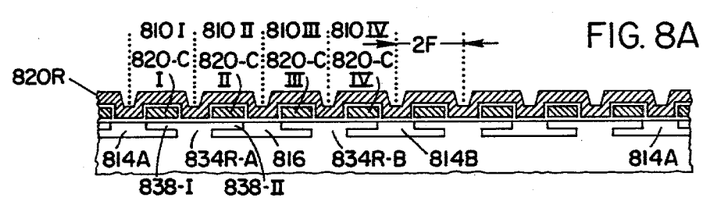
FIGS. 8A and 8B is a sectional side view of a four cycle read $2F \times 2F$ embodiment with a charge potential chart.

FIG. 8 shows a sectional sideview of a four cycle read cell pattern in which each memory cell is 2F×2F. Each drain 816 and associated sense amplifier receives read current from the two adjacent columns of cells on either side thereof defining a four cell unit (I, II, III, and IV) having a total area of 8F×2F. The selected row of cells requires four read cycles for a complete reading. The cells in each four cell unit are further addressed by four column leads 820C-I, 820C-II, 820C-III, and 820C-IV, and by two sources 814A and 814B.

The dimension of the four cell unit in the direction of row lead 720R (8F) is formed by one half of source 814A, column lead 820C-I, row gate zone 834R-A, column lead 820C-II, drain buss 816, column lead 820C-III, row gate zone 834R-B, column lead 820C-IV, and one half of source buss 814B. The dimension and sturcture of the four cell unit in the direction of the column leads (2F) is similar to the one cycle read embodiment of FIGS. 5C, 5D, and 5E.

Figure 8B:
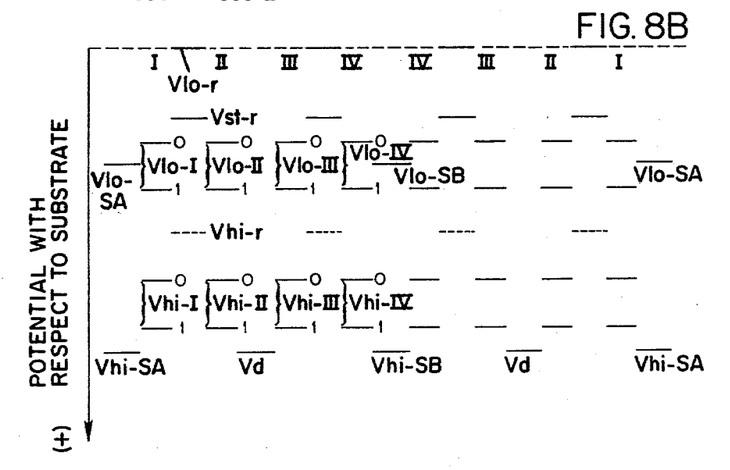

FIG. 8B is a potential diagram of four cell unit showing the relative values of source voltage Vs-lo and Vs-hi, drain voltage Vd, and the internal voltages within cell 810 established by external voltages applied to row lead 820R and column leads 820C. Accessing any particular cell, such as 810II, requires the coordination of four voltages:

1. Vhi-R applied to row lead 820R;
2. Vlo-SA applied to source 814;
3. Vlo-C applied to column lead 820C-II; and
4. Vhi-C applied to column lead 820C-I.

Vhi-R established Vhi-r within both row gate zones 834R-A and 834R-B, which causes an inversion region along the top of each row gate zone. Those inversion regions will support read current in the row gate zone 834R-B when the remaining three read voltages are applied. Vlo-r present within the non-accessed rows of cells is insufficient to create the required inversion layer. Vlo-SA applied to source 814A establishes a source-to-drain voltage favoring conduction through cells 810I and 810II. Vhi-SB applied to the non-accessed source 814B prevents any possibility of conduction through cells 810III and 810IV. Vlo-C applied to column lead 820C-II establishes Vlo-II within buried N region 838-II. Vlo-I may be either of two values and provides a conditional conduction path through buried N region 838 II. The Vlo-II for a recorded "1" is greater than Vlo-SA and supports read current. The Vio-II for a recorded "0" is less than Vlo-SA and prevents read current between source 814A and drain 816. Vhi-I established in the buried N regions 838 I for non-accessed cell 810 I by Vhi-C applied to its column electrodes. The buried N region 838 I is rendered unconditionally conductive because the Vhi-I associated with both a recorded "1" and a recorded "0" is greater than Vlo-SA.

The reduction in cell size is accompanied by an increase in the number of read cycles required to retrieve all the data stored in a row. The reduction in area is accomplished by requiring an increasing number of cell elements to function in an isolation capacity in addition to their normal function. This dual function is effected by positioning more cell elements along the boundary between adjacent columns of cells in place of an isolation strip. Each eliminated isolation strip reduces the cell length by one F unit—a two unit reduction in cell area. However, the boundary line elements must be shared between the adjacent columns which increases the number of accessing steps—read cycles. The following table shows the trade-off between cell area and reading complexity and shared elements.

| | Cell Area Table | | |
|---|---|---|---|
| Cell Area in F squared Units | Road Cycles Required | Busses Per Cell | Dual Function Boundary Line Elements |
| 10 (FIG. 5) | 1 | 2 | 0 |
| 8 (FIG. 6) | 1 | 1½ | 1 source 614 |
| 6 (FIG. 5) | 2 | 1 | 2 source 714 drain 716 |
| 4 (FIG. 4) | 4 | ½ | 3 source 814 drain 816 row gate zone |

The denser embodiments have multicycle read which increases the total data retrieval time. However, each additional read cycle reduces the number of required sense amplifiers by a factor of two.

CONCLUSION

The objects of this invention have been accomplished by providing a row-column access memory matrix in which hole charge stored during writing controls the data out electron current level during reading. The upper P region which stores the hole charge is isolated on all sides (except when receiving charge during write). The cells are high density because they do not require readout capacitors or separate gain transistors. The cell gain is provided by the stored hole charge which controls the readout current flow during read. The density of the cells approach the theoretical limit of 2F×2F for a cell matrix accessed along two dimensions (row and column). The densest embodiment obtains the 2F×2F limit. The high density is accomplished by sharing cell elements and busses among the adjacent columns of cells.

It will be apparent to those skilled in the art that additional changes and modifications may be made in the embodiments shown without departing from the scope of the invention. For example, the polarity type may be the reverse of that shown. In the reverse PNP embodiment electrons would be stored in an upper N region for controlling readout hole current through a buried P layer. Therefore, the scope of the invention is to be determined by the terminology of the following claims and the legal equivalents thereof.

I claim as my invention:

1. A random access memory capable of writing and storing data in and reading data out, formed by an array of semiconductor switches responsive to electrical control signals for redistributing carriers of one polarity type during writing as a function of data in, which redistributed carriers at least partially determine the data out current of the opposite polarity type carriers during reading, comprising:

a semiconductor substrate means of the one polarity type formed by a bulk portion and a processed portion;

a plurality of spaced source means and drain means of the opposite plurality type within the processed portion of the substrate means, and extending thereacross defining the array of semiconductor switches;

read path means within the processed portion of the substrate means between the source means and the drain means of each semiconductor switch for conducting the data out current during read;

memory storage means within the processed portion of the substrate means switch proximate the read path of each semiconductor switch, which receives a controlled quantity of carriers of the one polarity type from the bulk portion of the substrate means during writing as a function of the data in for determining the data out current between the source means and the drain means during read;

isolation means at least a portion of which is dynamic for storing carriers of the one polarity type in the memory storage means.

write path means within the processed portion of the substrate means, one for each semiconductor switch communicating between the memory storage means and the bulk portion of the substrate means for conducting the one polarity type carrier redistributed during writing; and control means proximate the path means within each semiconductor switch, responsive to the electrical control signals for establishing electrical fields which control the dynamic portion of the isolation means permitting control of the redistribution of the one polarity type carriers as a function of data in, and which promote data out current of the opposite polarity type carriers during read as a function of the one polarity type carriers stored in the memory storage means.

2. The random access memory of claim 1, wherein the control means include:

write path gate means proximate the write path for providing the electric field which controls the conductivity of the write path memory gate means proximate the memory means for providing the electric field which controls the quantity of redistributed carriers received by the memory means when the write path is conductive.

3. The random access memory of claim 2, wherein each semiconductor switch has a plurality of memory regions with a memory gate proximate each memory region.

4. The random access memory of claim 3, wherein each semiconductor switch comprises:

a first memory region of the one polarity type proximate the source means for that semiconductor switch, a second memory region of the one polarity type proximate the drain means for that semiconductor switch, a write gate between the gate of the first memory region and the gate of the second memory region;

a first region of the opposite polarity type extending from the source means towards the write gate under the first memory region; and a second region of opposite polarity type extending from the drain means toward the write gate under the second memory region.

5. The random access memory of claim 2, wherein the array of semiconductor switches is arranged in a row by column matrix, and the control means within each semiconductor switch includes row accessing gate means and column accessing gate means for individually accessing each semiconductor switch for writing and reading.

6. The random access memory of claim 5, wherein:

the write path gate means and one of the accessing gate means is formed by a single first electrode structure positioned between the source means and drain means within each switch proximate the write path means; and the memory gate means and the other one of the accessing gate means is formed by a single electrode structure positioned between the source means and the drain means within each switch proximate the memory means in series relationship with the first electrode structure.

7. The random access memory of claim 6, wherein:

the first electrode structure receives a first storage control signal of the one polarity relative to the substrate means when the first electrode structure is not being accessed to write or to read, for establishing a depletion region in at least that portion of the write path means proximate the first electrode structure for preventing the conduction of the one polarity type carriers;

the second electrode structure receives a second storage control signal of the one polarity type relative to the substrate means when the second electrode structure is not being accessed to write or to read, for inhibiting further transfer of the one polarity type carrier into the memory means; and at least one of the electrode structures receives a read control signal for permitting carriers of the opposite polarity type to flow along the read path means between the source means and the drain means subject to the intensity of the redistributed charge contained in the memory means.

8. The random access memory of claim 6, wherein;
the write path means is a semiconductor material of the one polarity type;
the first electrode structure receives a write control signal during writing in order to access the semiconductor switch for writing, and to render the write path means conductive permitting the one polarity type carriers to accumulate proximate thereto for entry into the memory means; and
the second electrode structure receives a data in control signal during writing in order to access the semiconductor switch for writing and for controlling the quantity of redistributed carriers received by the memory means through the write path means from the bulk portion of the substrate means while the write control signal is applied to the first electrode structure.

9. The random access memory of claim 8, wherein the data in control signal has two voltage levels, one level of which permits a greater charge of redistributed carriers of the one polarity type to enter the memory means during writing and the other level of which permit a lesser charge of redistributed carriers of the one polarity type to enter the memory means during writing, for defining two data out current levels of the opposite polarity type carriers in the read path means during reading.

10. The random access memory of claim 8, wherein the data in control signal varies over a range of voltage levels for permitting a corresponding range of redistributed charge intensities with in the memory means for defining a range of data out current levels.

11. The random access memory of claim 8, wherein:
the read path means extends between the source means and the drain means proximate the first and second electrode structures and the memory storage means, for conducting data out current of the opposite polarity type carriers in response to redistributed charge within the memory storage means when both electrode structures are accessed for reading,
the portion of the read path means proximate the second electrode structure is of the opposite polarity type; and
the memory storage means is between the second electrode structure and the opposite polarity type portion of the read path, and cooperates with a second read control signal applied to the second electrode to control the flow of data out current in the adjacent opposite polarity type portion of the read path.

12. The random access memory of claim 1, wherein the memory storage means is a semiconductor region of the one polarity type.

13. The random access memory of claim 11, wherein the memory storage means is a surface layer of the one polarity type along the interface between the second electrode structure and the opposite polarity type portion of the read path.

14. The random access memory of claim 11, wherein;
the source means and the drain means are busses of the opposite polarity type diffused into the substrate means and extending on either side of each semiconductor switch;
the opposite polarity type portion of the read path of each semiconductor switch is in electrical contact with the drain means, and is depleted of opposite polarity type carriers by the drain voltage during writing; and
the portion of the read path proximate the first electrode is in electrical contact with the source means, and is of the one polarity type conductive to opposite type polarity carriers in response to a first read control signal applied to the first electrode which causes an opposite type polarity inversion region to extend from the source means along the one polarity type portion of the read path to the opposite type polarity portion of the read path.

15. The random access memory of claim 14, wherein:
the first electrode structure is proximate the source means and is the row access gate, and the second electrode is proximate the drain means and is the column access gate;
each semiconductor switch is write accessed by the write control signal applied to the first electrode structure in combination with the data in control signal applied to the second electrode structure; and
each semiconductor switch is read accessed by a first read control signal applied to the first electrode structure in combination with a second read control signal applied to the second electrode structure.

16. The random access memory of claim 15, wherein the one polarity type is P and the opposite polarity type is N.

17. The random access memory of claim 11, wherein the isolation means surrounds the memory storage means during storage and reading for preventing the conduction of both polarity type carriers thereinto.

18. The random access memory of claim 17, wherein the dynamic portion of the isolation means is along the side of the memory storage means facing the source means, and is a depletion region formed in the adjacent write path by the control signals applied to the first electrode structure.

19. A semiconductor switch having a plurality of stored charge levels therein formed by one polarity carriers and a corresponding plurality of current levels therethrough formed by the opposite polarity carriers and responsive to control signals applied to the semiconductor switch, comprising:
a base means for supporting the semiconductor switch;
a first terminal means carried by the base means;
a second terminal means carried by the base means in spaced relationship to the first terminal means;
control means carried by the base means responsive to the control signals for controlling the charge and current levels;
a current path between the first terminal means and the second terminal which becomes conductive for carriers of the opposite polarity in response to the control means;
memory means proximate the current path and responsive to the control means for receiving one of the plurality of stored charge levels of the one polarity carriers to maintain one of the plurality of current levels of carriers of the opposite polarity in the current path when current flows therein;
a reservoir of carriers of the one polarity carried by the base means; and a charge path between the memory means and the reservoir of carriers for conducting carriers of the one polarity therebetween in response to the control means.

20. The semiconductor switch of claim 19, wherein the control means includes a charge path control means which controls the conduction of the one polarity type carriers along the charge path by establishing and disrupting the continuity of the charge path.

21. The semiconductor switch of claim 20, wherein the plurality of memory charge control signals form a continuous range of voltage levels which support a continuous range of memory charge electric field intensities defining a continuous range of stored charge levels and a continuous range of current levels.

22. The semiconductor switch of claim 20, wherein the charge path control means is responsive to charge path control signals for establishing the continuity of the charge path in order for the memory means to receive one of the plurality of stored charge levels, and for disrupting the continuity of the charge path thereafter.

23. The semiconductor switch of claim 22, wherein the charge path control signals include a continuity signal and a discontinuity signal for controlling the continuity of the charge path.

24. The semiconductor switch of claim 23, wherein the charge path control signals are direct current voltages.

25. The semiconductor switch of claim 24, wherein the charge path control signals are direct current voltages of the one polarity with respect to and the discontinuity voltage exceeds the continuity voltage.

26. The semiconductor switch of claim 22, wherein the control means includes a memory charge control means for controlling the flow of one polarity carriers from the charge path into the memory means.

27. The semiconductor switch of claim 26, wherein the memory charge control means is responsive to memory charge control signals for establishing the level of the charge stored in the memory.

28. The semiconductor switch of claim 27, wherein the memory charge control signals include a plurality of bias levels for defining the plurality of stored charge levels.

29. The semiconductor switch of claim 27, wherein the charge path control means is a gate means proximate the charge path which provides a charge path electric field in response to the charge control signals for controlling the continuity of the charge path.

30. The semiconductor switch of claim 29, wherein the storage path control gate means has an electrode member responsive to discrete voltage levels of the charge path control signals to provide discrete charge path electric field intensities in the charge path.

31. The semiconductor switch of claim 30, wherein the charge control signals have two discrete voltage levels:
  a continuity voltage level which supports conduction of the one polarity carriers; and
  a discontinuity voltage level which provides a charge path electric field sufficient to create a depletion condition of the one polarity type within at least a portion of the charge path thus preventing conduction of the one polarity carriers between the memory means and the reservoir means.

32. The semiconductor switch of claim 31, wherein the memory charge control means is a gate means proximate the memory means which provides a memory charge electric field within the memory means for determining the charge level thereof.

33. The semiconductor switch of claim 32, wherein the memory charge gate means includes an electrode responsive to a plurality of memory charge control signals for providing a plurality of memory charge electric field intensities which define the plurality of stored charge levels.

34. The semiconductor switch of claim 33, wherein the plurality of memory charge control signals have discrete voltage levels which support discrete memory charge electric field intensities defining discrete stored charge levels within the memory means.

35. The semiconductor switch of claim 34, wherein the memory charge control signals have two discrete levels which support two discrete memory charge electric fields defining two discrete stored charge levels.

36. The semiconductor switch of claim 35, wherein one of the discrete stored charge level is a high charge of the one polarity carriers which results in a correspondingly high current flow of the opposite polarity carriers, and the other of the discrete stored charge levels is a low charge of the one polarity carriers which results in a correspondingly low current flow of the opposite polarity carriers.

* * * * *